United States Patent [19]
Ikai et al.

[11] Patent Number: 6,015,951
[45] Date of Patent: Jan. 18, 2000

[54] PHOTOELECTRIC TRANSFER DEVICE

[75] Inventors: Keizo Ikai, Kanagawa-ken; Mitsuo Matsuno, Yokohama, both of Japan

[73] Assignee: Nippon Oil Company, Limited, Tokyo, Japan

[21] Appl. No.: 08/975,089

[22] Filed: Nov. 20, 1997

[51] Int. Cl.⁷ ....................... H01L 31/0216; G02F 1/133
[52] U.S. Cl. ................ 136/257; 136/243; 136/246; 136/251; 136/256; 136/259; 136/260; 136/261; 136/262; 136/264; 136/258; 126/701; 126/705; 126/710; 126/711; 126/707; 257/433; 257/435; 257/52; 429/111
[58] Field of Search .................................. 136/243, 246, 136/251, 256, 259, 257, 260, 261, 262, 264, 265, 258 PC, 258 AM; 126/701, 705, 710, 711, 707; 257/433, 435, 52; 429/111

[56] References Cited

U.S. PATENT DOCUMENTS 5,725,006  3/1998  Kawama et al. ...................... 139/251

FOREIGN PATENT DOCUMENTS

| | | |
|---|---|---|
| 639450 | 2/1995 | European Pat. Off. . |
| 844673 | 5/1998 | European Pat. Off. . |
| 60-147718 | 8/1985 | Japan . |
| 60-148173 | 8/1985 | Japan . |
| 5-29641 | 2/1993 | Japan . |
| 6-234182 | 8/1994 | Japan . |
| 7-74380 | 3/1995 | Japan . |

OTHER PUBLICATIONS

English Abstract for JP 8–83920A, Mar. 1996.
English Abstract for JP 58–218179A, Dec. 1993.

*Primary Examiner*—Alan Diamond
*Attorney, Agent, or Firm*—Scully, Scott, Murphy & Presser

[57] ABSTRACT

This invention relates to a photoelectric transfer device which comprises a photoelectric transfer element, a cholesteric liquid crystal layer and an ultraviolet cut-off layer, said cholesteric liquid crystal layer being arranged between said photoelectric transfer element and said ultraviolet cut-off layer and said ultraviolet cut-off layer being arranged at the side for the incidence of light. According to this invention, there is provided a colorful photoelectric transfer device which is prepared at an inexpensive cost without a marked decrease in the generation efficiency of the photoelectric transfer element and is fit to be used over a prolonged period.

10 Claims, No Drawings

PHOTOELECTRIC TRANSFER DEVICE

BACKGROUND OF THE INVENTION

This invention relates to a photoelectric transfer device. More particularly, it is concerned with a photoelectric transfer device wherein a marked reduction in a generating efficiency is not observed in a photoelectric transfer element, a color tone in exterior appearance is particularly attractive depending upon its usage or its installed place and the color tone is not deteriorated and may be retained even after its use over a long period of time.

A photoelectric transfer device, inter alia, a solar battery has been recently installed in general houses or buildings as an electricity generation system utilizing sunlight and it has been also utilized for a desk-top calculator, a watch, etc.

However, the prior art solar battery has been designed to enhance absorption of light for increasing a generating efficiency and their exterior appearance has been limited to black-colored or similarly colored toward black so that it is restricted in its design. Accordingly, there has been raised the problem of the color tone when installed on the roofs of general houses or applied to the external walls of buildings.

There was also seen the case where installation of solar battery could not be admitted in a certain national park in view of the color tone problem. Moreover, there were some cases where it was difficult to be applied as exterior building parts or members.

In order to solve the above problems, there have been proposed several methods for coloring a photoelectric transfer device as seen, for example, in JP58-218179A, JP60-147718A, JP60-148172A, JP60-148173A, JP60-148174A, JP Hei 5-29641A, JP Hei 7-74380A, JP Hei 8-46228A, JP Hei 8-83920A, and Japanese Utility Model Kokai Applications Hei 5-93057 and Hei 4-97362.

Of these prior arts, JP58-218179A discloses a thin film solar battery wherein coloring agents such as dyestuffs and the like are incorporated into a light transmitting resin, but a generating efficiency is greatly reduced owing to optical absorption by the dyestuffs in this solar battery.

JP Hei 8-83920A discloses a solar cell wherein a thickness of a reflection protection film formed over the surface of a solar battery element may be controlled to adjust reflection factors to lights of various wave lengths, whereby different colorations may be developed. However, fabrication conditions for elements in this instance are required to be altered in compliance with the respective different colors, which leads to an expensive cost.

Other methods have been proposed to form a cholesteric polymer sheet and the like on the front face of a solar battery so as to selectively reflect the light of a specific wave length, whereby a colorful appearance may be available. However, the cholesteric polymer sheet tends to be deteriorated under irradiation of sunlight and the solar battery has not been fit to be used over a long period of time.

It is an object of this invention to solve the above problems and, more specifically, to provide a colorful photoelectric transfer device which can be fabricated at a low cost without any marked reduction in the generating efficiency of a photoelectric element and can be fit to be used over a long period of time.

SUMMARY OF THE INVENTION

The present inventors have made earnest studies, bearing in mind the above problems to be solved, and have found as a result that deterioration of a cholesteric liquid crystal layer can be inhibited to prevent color fading by providing a cholesteric liquid crystal layer on the incident beam side of a photoelectric transfer element and further an ultraviolet cut-off layer or an ultraviolet screening layer outwardly from the said incident beam side, whereby there can be manufactured a colorful photoelectric transfer device which is inexpensive and has an extended lifetime over a long period. Thus, this invention has been completed upon this finding.

More specifically, this invention is directed to a photoelectric transfer device which comprises a photoelectric transfer element, a cholesteric liquid crystal layer and an ultraviolet cut-off layer, said cholesteric liquid crystal layer being placed between said photoelectric transfer element and said ultraviolet cut-off layer and said ultraviolet cut-off layer being located on the incident beam side of said photoelectric transfer element.

DETAILED DESCRIPTION OF THE INVENTION

This invention will be explained in detail hereafter.

The photoelectric elements which may be used in this invention is not particularly critical and a variety of the elements may be used. They include those elements generally called solar battery cells.

The term "a photoelectric element" means to indicate a basic unit composed of a photoelectric cell having a photovoltaic effect.

As the photoelectric elements, there may be mentioned, for example, silicon elements, compound semiconductor elements and other elements from the aspect of the materials thereof, and single crystal elements, polycrystal elements, amorphous elements and the like from the aspect of the crystal structure thereof. More specifically, there may be used various photoelectric elements, typically, (1) silicon elements such as silicon single crystal elements, silicon polycrystal elements, amorphous silicon elements and the like, (2) compound semiconductor elements formed from, for example, III–V semiconductors (e.g., GaAs, InP and the like) composed of the elements of the Group III in the Periodic Table (e.g., Ga, In and the like) and the elements of the Group V (e.g., P, As and the like), II–VI semiconductors (e.g., CdS, CdTe, CdS/CdTe and the like composed of the elements of the Group II in the Periodic Table (e.g., Zn, Cd and the like) and the elements of the Group VI (e.g., S, Se, Te and the like), chalcopyrite compounds (e.g., $CuInSe_2$ and the like), (3) various inorganic elements of $Zn_3P_2$, Se, $Cu_2S$, spherical Si and the like, (4) various organic semiconductor elements of merocyanine, phthalocyanine, poly (vinylcarbazole)-trinitrofluorene and the like, (5) wet elements composed of electrolyte solutions and two electrodes (also referred to as wet solar battery cells).

The cholesteric liquid crystal layer which may be used in this invention means a film-like form made from a high-molecular or low-molecular cholesteric liquid crystalline compound, and there may be mentioned, for example, a film formed from a cholesteric liquid crystalline polymer composition, a film-like product made by pulverizing a cholesteric liquid crystalline polymer or a cholesteric liquid crystalline polymer composition and molding to a film-like form with a suitable binder, or a film-like product made by dispersing microcapsules of a cholesteric liquid crystal in a suitable binder and molding to a film-like form. The cholesteric liquid crystalline film will be more fully explained hereafter.

The cholesteric liquid crystalline film which may be employed in this invention can be prepared by coating a cholesteric liquid crystalline polymer composition, which is prepared by adding a predetermined amount of an optically active compound to a nematic liquid crystalline polymer exhibiting a uniform nematic orientation of monodomain and capable of easily immobilizing the said oriented state, or a cholesteric liquid crystalline polymer exhibiting a uniform nematic orientation of monodomain and capable of easily immobilizing the said oriented state onto an oriented film formed over a transmitting substrate, drying and thermally treating to form a uniform cholesteric orientation of monodomain, followed by cooling, whereby the orientation in a liquid crystalline state, namely the cholesteric orientation is immobilized or fixed without any damage.

The cholesteric orientation as referred to herein is specifically meant to indicate a helical structure having one or more periods toward its thickness although a length of pitch may be optionally selected, and a length of pitch is usually not more than 3 μm, preferably not more than 2 μm.

Specifically stated in regard to a cholesteric liquid crystalline polymer composition composed of a nematic liquid crystalline polymer and an optically active compound, it is essential that the nematic liquid crystalline polymer which may exhibit a basic uniform, monodomain nematic orientation and easily immobilize the said oriented state shall have the following properties:

It is significant that there is not involved a crystalline phase at a lower temperature region than the nematic phase from the aspect of a phase series of liquid crystals in order to perform a stable immobilization of a nematic orientation. Where these phases are present, these phases are necessarily passed through when cooled for immobilization and consequently the nematic orientation once formed is destructed, which leads to unsatisfactory transparency and performance.

Accordingly, where a cholesteric liquid crystalline polymer film is to be prepared as a cholesteric liquid crystal layer of this invention, it is essential to use a nematic liquid crystalline polymer having a glass phase at a lower temperature region than a nematic phase. By adding an optically active compound to such a polymer, a cholesteric orientation may be formed in a liquid crystalline state and a glass phase may be formed at a lower point than a liquid crystal transition point. Thus, a cholesteric liquid crystalline polymer composition can be formed as a preferred starting material for forming the cholesteric liquid crystal layer of this invention.

As such a cholesteric liquid crystalline polymer there may be used any polymer if it exhibits a cholesteric orientation in the state of liquid crystal and assumers a glass phase at a temperature below a liquid crystal transition point thereof. Examples are main chain type liquid crystalline polymers such as polyesters, polyamides, polycarbonates and polyesterimides, as well as side chain type liquid crystalline polymers such as polyacrylates, polymethacrylates, polymalonates and polysiloxanes. Particularly, polyesters are preferred in point of easy preparation, superior transparency and orientatability and high glass transition point. Above all, polyesters containing an ortho-substituted aromatic unit as a constituent are most preferred. Polymers containing as a constituent an aromatic unit having bulky substituent group in place of such ortho-substituted aromatic unit or an aromatic unit having fluorine or a fluorine-containing substituent group, are also employable. The "ortho-substituted aromatic unit" as referred to herein means a structural unit with main chain-constituting bonds ortho to each other. Examples are the following catechol, salicylic acid and phthalic acid units, as well as substituted derivatives thereof having substituent groups on their benzene rings:

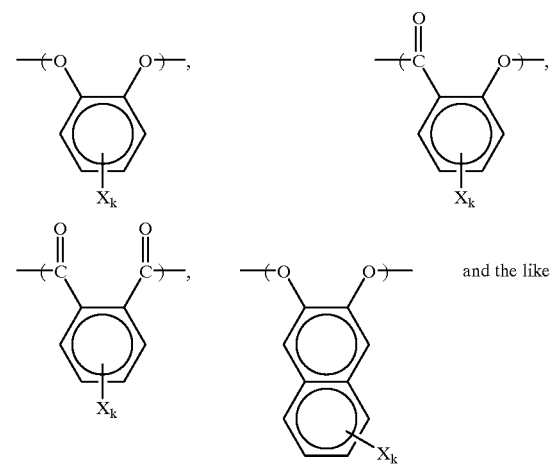

wherein X represents hydrogen, halogen, e.g. Cl or Br, an alkyl or alkoxy group having 1 to 4 carbon atoms, or phenyl, and k is 0 to 2.

The following are particularly preferred:

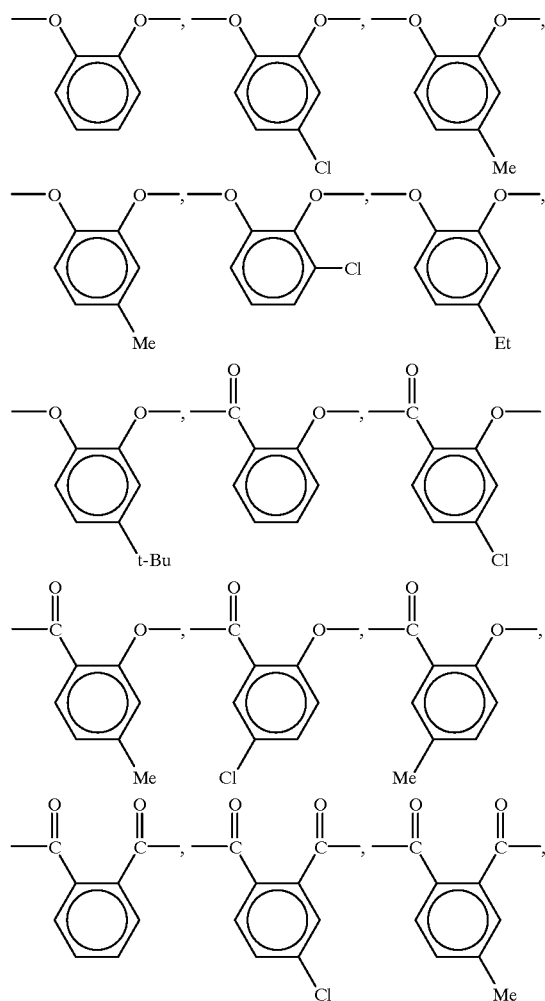

-continued

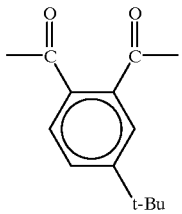

Also, as examples of the polyester used preferably in the present invention there are mentioned those containing as repeating units (a) a structural unit (hereinafter referred to as "diol component") derived from a diol and a structural unit ("dicarboxylic acid component" hereinafter) derived from a dicarboxylic acid and/or (b) a structural unit ("hydroxycarboxylic acid component" hereinafter) derived from a hydroxycarboxylic acid containing both carboxyl and hydroxyl groups in one unit. Preferably, these polyesters further contain the foregoing ortho-substituted aromatic unit.

As examples of the diol component there are mentioned the following aromatic and aliphatic diols:

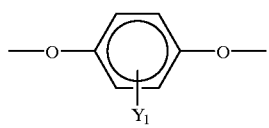

wherein Y represents hydrogen, halogen, e.g. Cl or Br, an alkyl or alkoxy group having 1 to 4 carbon atoms, or phenyl, and l is 0 to 2,

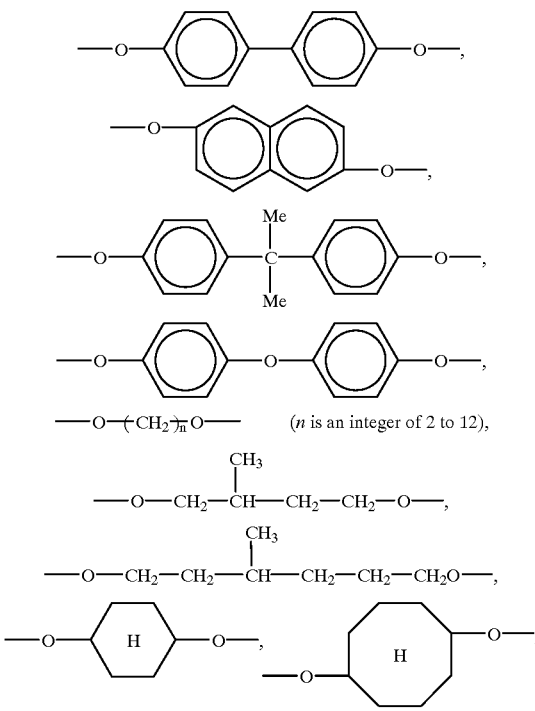

Particularly, the following are preferred:

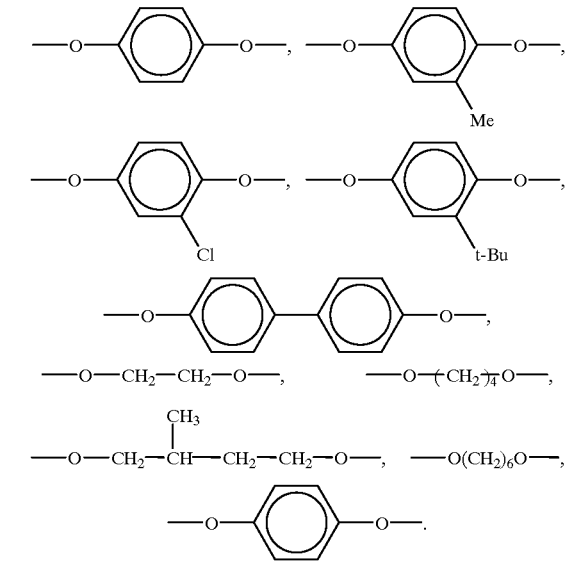

As examples of the dicarboxylic acid component, the following may be mentioned:

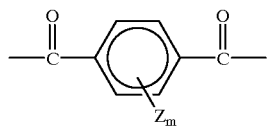

wherein Z represents hydrogen, halogen, e.g. Cl or Br, an alkyl or alkoxy group having 1 to 4 carbon atoms, or phenyl, and m is 0 to 2,

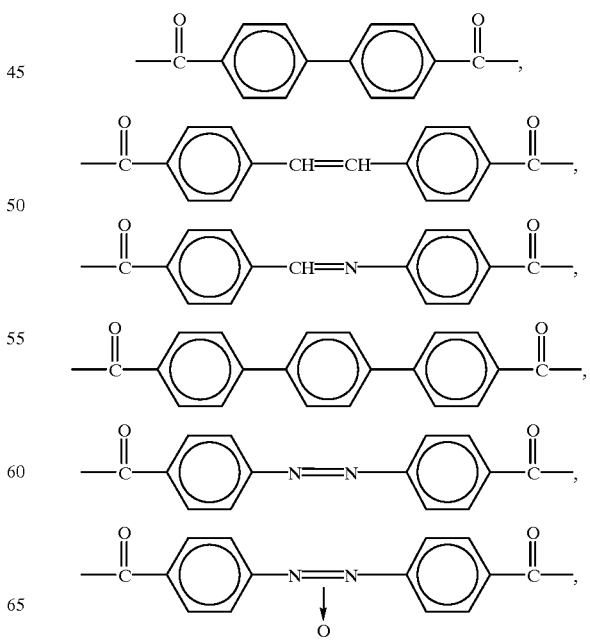

-continued

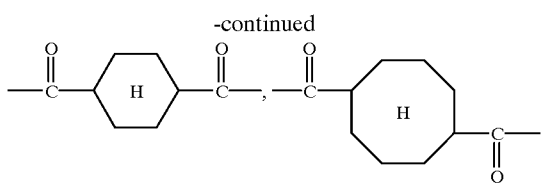

Particularly, the following are preferred:

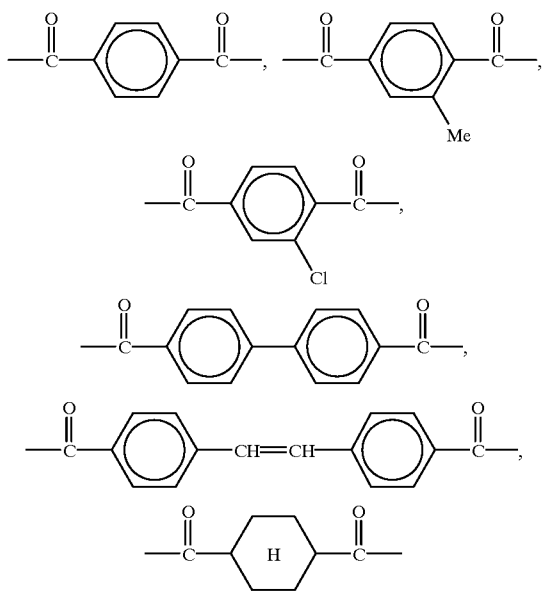

As examples of the hydroxycarboxylic acid component, the following units may be mentioned:

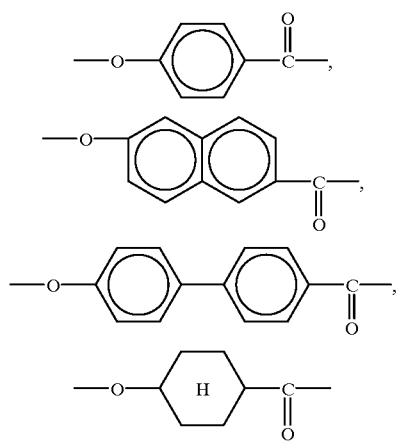

The dicarboxylic acid to diol mole ratio is approximately 1:1 like that of polyesters commonly used (carboxyl to hydroxyl ratio in the case of using a hydroxycarboxylic acid). The proportion of ortho-substituted aromatic units in the polyester is preferably in the range of 5 to 40 mole %, more preferably 10 to 35 mole %. In the case where the said proportion is smaller than 5 mole %, a crystal phase tends to appear under the nematic phase, so such proportion is not desirable. A proportion larger than 40 mole %, is not desirable, either, because the polymer will no longer exhibit liquid crystallinity. The following are typical examples of polyesters which may be used in the present invention:

Polymer consisting essentially of the following structural units:

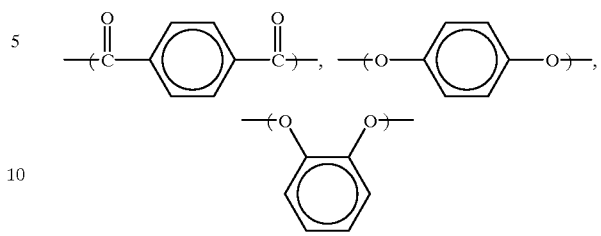

Polymer consisting essentially of the following structural units:

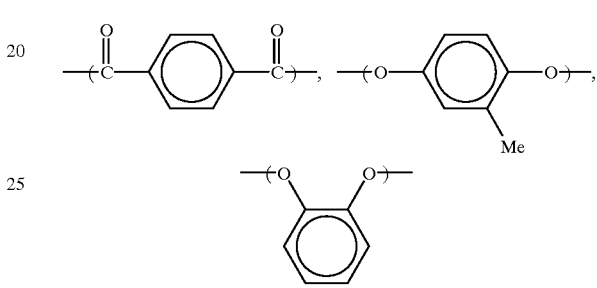

Polymer consisting essentially of the following structural units:

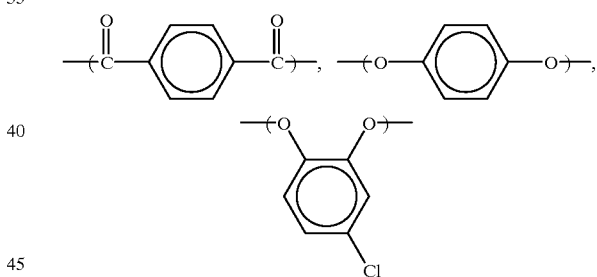

Polymer consisting essentially of the following structural units:

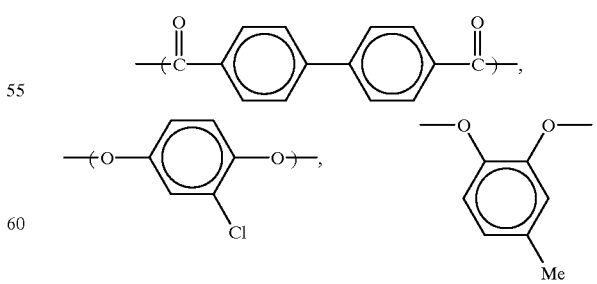

Polymer consisting essentially of the following structural units:

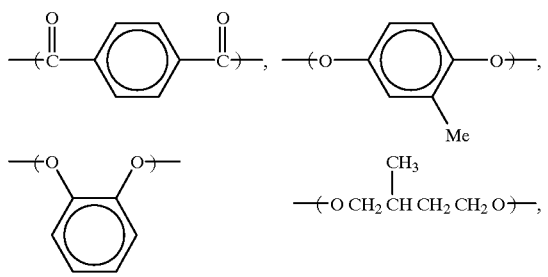

Polymer consisting essentially of the following structural units:

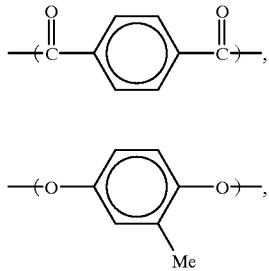

Polymer consisting essentially of the following structural units:

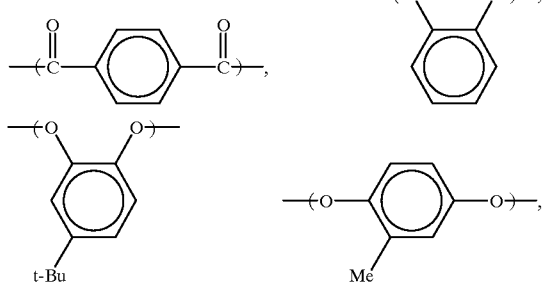

Polymer consisting essentially of the following structural units

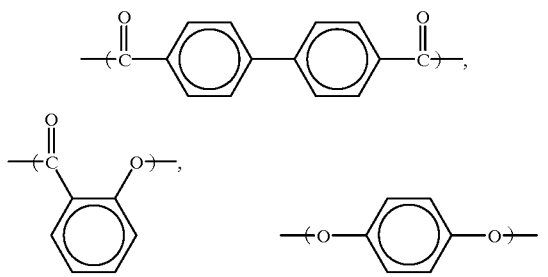

Polymer consisting essentially of the following structural units:

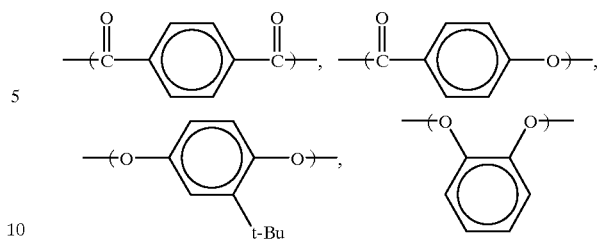

In the present invention, polyesters having bulky aromatic or polycyclic hydrocarbons as shown below as structural units in place of ortho-substituted aromatic units can be used as starting polymers of the cholesteric liquid crystalline polymer films of the present invention.

The "bully aromatic" as referred to herein means an aromatic rug having hydrocarbon group(s) having 3–8, preferably 3–6, carbon atoms and/or halogen(s) as substituent group(s). Examples are benzene or biphenyl substituted by hydrocarbon group(s) such as alkyl groups, e.g. n-propyl, isopropyl, n-butyl, isobutyl, sec-butyl, tert-butyl, n-pentyl, isopentyl, n-hexyl and isohexyl, aryl group, e.g. phenyl and tolyl, and aralkyl group, e.g. benzyl, or fluorine, chlorine or the like. Of course, the above hydrocarbon groups partially or wholly substituted by halogen atoms can also be used. Examples of the polycyclic hydrocarbon include fused polycyclic aromatics having 7–12, preferably 7–10, carbon atoms, such as naphthalene ring and fused polycyclic hydrocarbons having a norbornane structure.

As examples of the aromatic unit and polycyclic unit, the following may be mentioned:

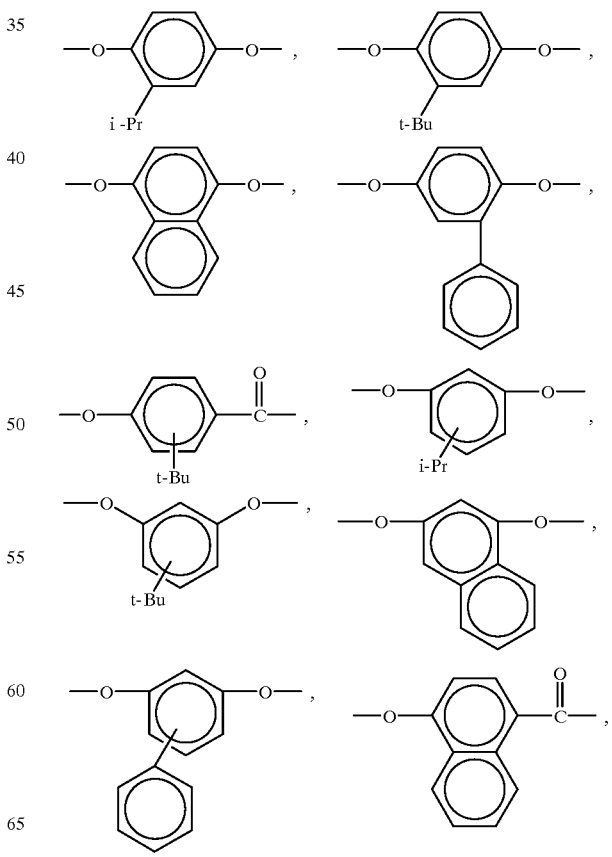

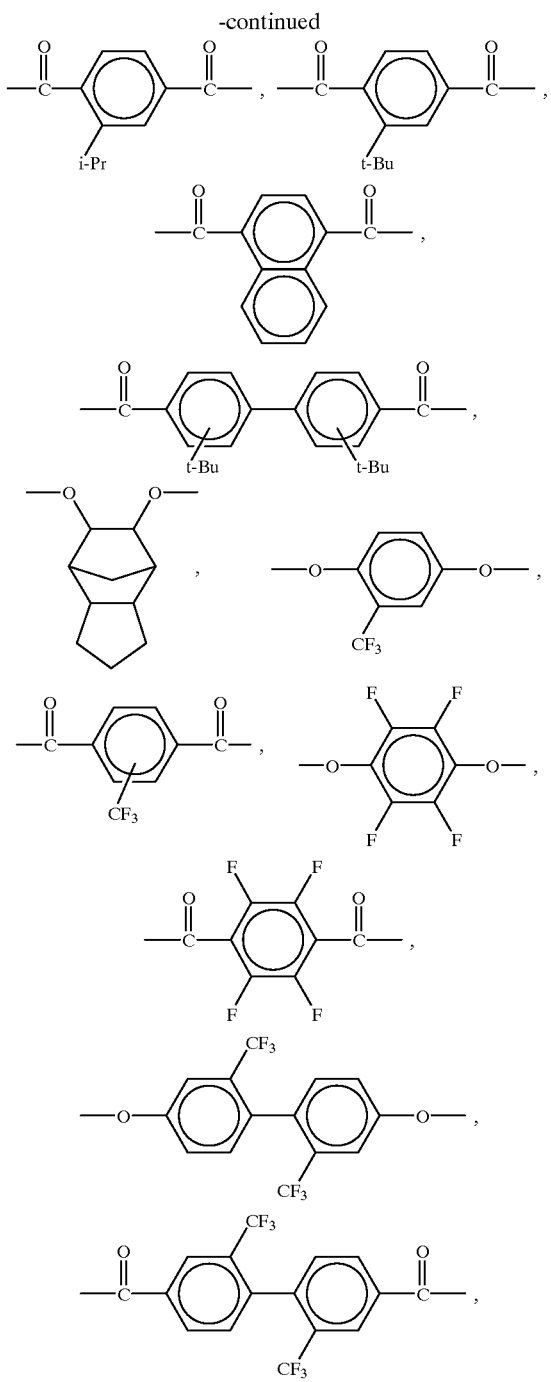

Polymers having both of the above bulky aromatic or polycyclic hydrocarbon unit and the before-mentioned ortho-substituted aromatic unit may also be preferably used in the present invention.

The polymers exemplified above range in molecular weight preferably from 0.05 to 3.0, more preferably 0.07 to 2.0, in terms of inherent viscosity as determined at 30° C. in a solvent, e.g. a mixed phenol/tetrachloroethane [60/40 (weight ratio)] solvent. An inherent viscosity lower than 0.05 is not desirable because the strength of the resulting nematic liquid crystal line polymer will be low, while if the inherent viscosity is higher than 3.0, there will arise such problems as the deterioration of orientatability and an increase of the time required for orientation because of too high viscosity during the formation of liquid crystal. The glass transition points of these polyesters are also important, exerting influence on the stability of orientation after the immobilization thereof. The glass transition temperature is usually higher than 0° C., preferably higher than 10° C.

In usual use, such devices may be used at about room temperature and thus the glass transition temperature is more preferably higher than 30° C., most preferably higher than 50° C. If the glass transition temperature is lower than 0° C., the immobilized liquid crystal structure is likely to be changed when used at about room temperature thereby lowering the functions based on the liquid crystal structure.

How to prepare the polymer used in the present invention is not specially limited. There may be adopted any of the polymerization processes known in this field, e.g. a melt polymerization process or an acid chloride process using an acid chloride of a corresponding dicarboxylic acid.

According to a melt polycondensation process, the polyester can be prepared by polymerizing a corresponding dicarboxylic acid and an acetylated compound of a corresponding diol at a high temperature and in a high vacuum. The molecular weight thereof can be adjusted easily by controlling the polymerization time or the feed composition. For accelerating the polymerization reaction there may be used a known metal salt such as sodium acetate. In the case of using a solution polymerization process, the polyester can be prepared easily by dissolving predetermined amounts of a dicarboxylic acid dichloride and a diol in a solvent and heating the resulting solution in the presence of an acid acceptor such as pyridine.

An explanation will now be made about an optically active compound which is incorporated in the nematic liquid crystalline polymers exemplified above for imparting twist thereto. Typical examples are optically active low-molecular compounds. Any compound having optical activity can be used in the present invention, but from the standpoint of compatibility with the base polymer it is desirable to use optically active, liquid crystalline compounds. The following are concrete examples:

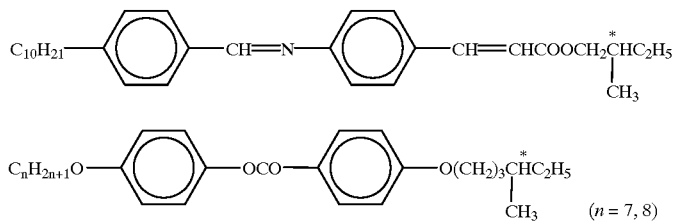

-continued

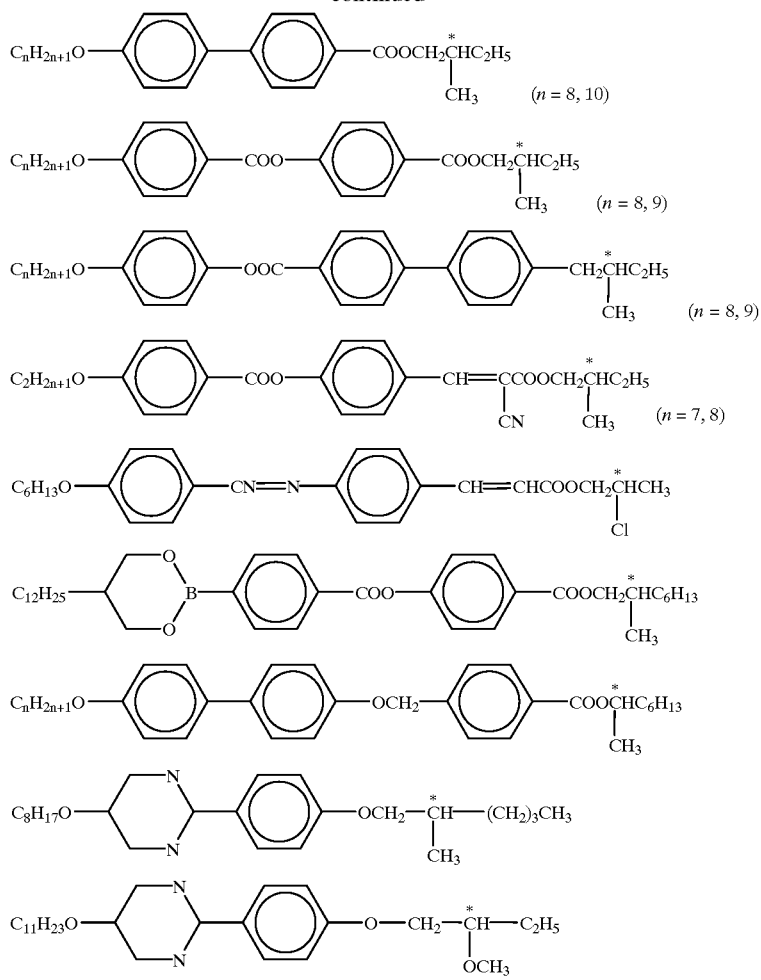

cholesterol derivatives.

As examples of the optically active compound used in the present invention there also may be mentioned optically active polymers. Any high polymer may be used if only it contains an optically active group in the molecule, but when the compatibility with the base polymer is taken into account, it is desirable to use a polymer which exhibits liquid crystallinity. Examples are the following liquid crystalline high polymers having optical activity: polyacrylates, polymethacrylates, polymalonates, polysilolxanes, polyesters, polyamides, polyester amides, polycarbonates, polypeptides, and cellulose. Above all, from the standpoint of compatibility with the nematic liquid cryatalline polymer serving as the base, mainly aromatic, optically active polyesters are most preferred. Examples are the following polymers:

Polymer consisting essentially of the following structural units:

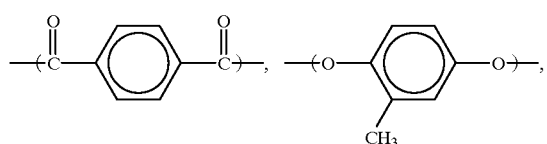

-continued

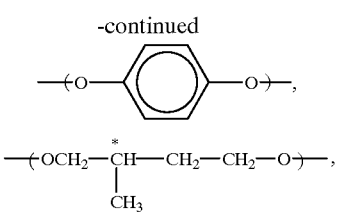

Polymer consisting essentially of the following structural units:

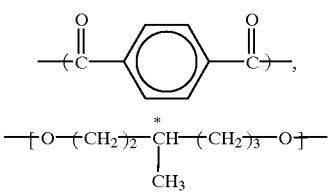

Polymer consisting essentially of the following structural units:

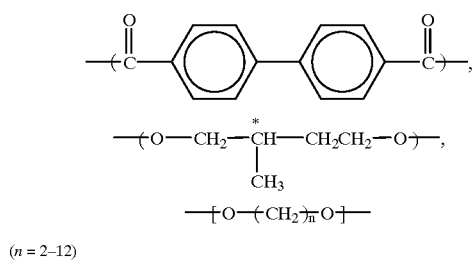

($n = 2–12$)

Polymer consisting essentially of the following structural units:

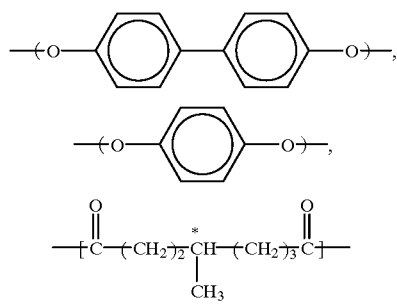

Polymer consisting essentially of the following structural units:

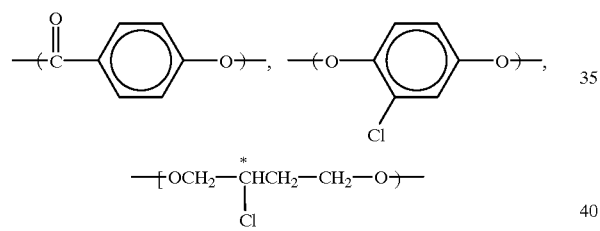

Polymer consisting essentially of the following structural units:

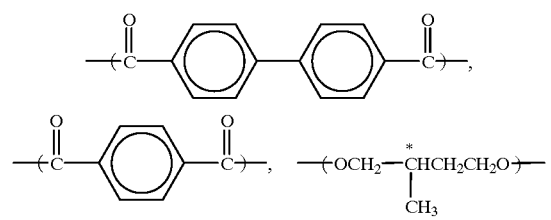

Polymer consisting essentially of the following structural units:

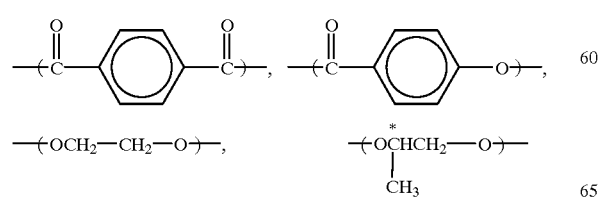

Polymer consisting essentially of the following structural units:

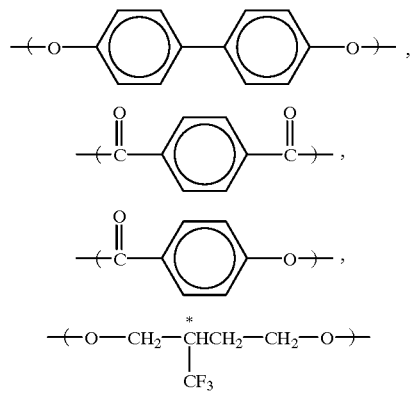

Polymer consisting essentially of the following structural units:

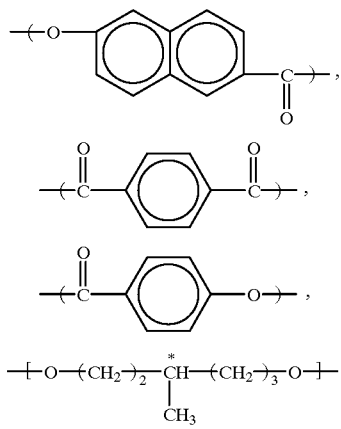

Polymer consisting essentially of the following structural units:

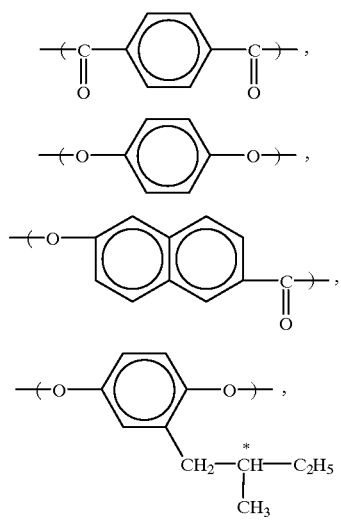

Polymer consisting essentially of the following structural units:

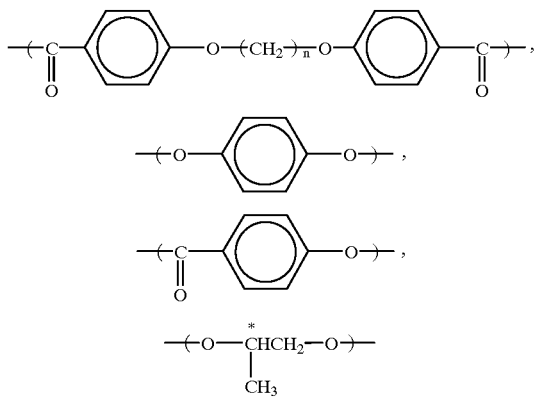

Polymer consisting essentially of the following structural units:

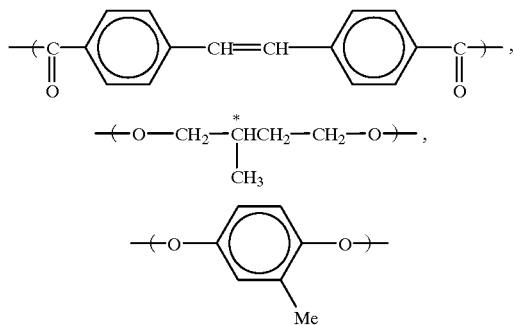

In each of these polymers, the proportion of the unit having an optically active group is usually in the range of 0.5 to 80 mole %, preferably 5 to 60 mole %.

These polymers preferably range in molecular weight from 0.05 to 5.0 in terms of inherent viscosity as determined at 30° C. in phenol/tetrachloroethane for example. An inherent viscosity larger than 5.0 is not desirable because of too high viscosity which eventually causes deterioration of orientatability. An inherent viscosity smaller than 0.05 is not desirable, either, because it becomes difficult to control the composition.

In the present invention, the composition can be prepared by mixing a nematic liquid crystalline polymer and an optically active compound at a predetermined ratio by a solid mixing, solution mixing or melt-mixing method. The proportion of the optically active component in the composition is in the range of preferably 0.5 to 70 wt %, more preferably 1 to 60 wt %, although it differs depending on the proportion of optically active groups contained in the optically active compound or the aimed pitch length. If the proportion of the optically active compound is less than 0.5 wt %, it will be impossible to impart a sufficient twist to the nematic liquid crystal, and a proportion thereof greater than 70 wt % will exert a bad influence on the orientation.

Next, a cholesteric liquid crystalline polymer which provides a uniform, cholesteric orientation of monodomain for itself without using any other optically active compound and which permits the state of such orientation to be immobilized easily and which can be used as a preferable material of the cholesteric liquid crystalline layer in the present invention will be explain. It is essential that the polymer in question have an optically active group in the polymer chain and be optically active. Examples are main chain type liquid crystalline polymers such as polyesters, polyamides, polycarbonates and polyesterimides, as well as side chain type liquid crystalline polymers such as polyacrylates, polymethacrylates and polysiloxanes. Polyesters are particularly preferred in point of easiness of preparation, superior orientatability and high glass transition point. Most preferred polyesters are those which contain ortho-substituted aromatic units as constituents. But also employable are polymers which, in place of such ortho-substituted aromatic units, contain as constituents bulky substituent-containing aromatic units or aromatic units having halogen or halogen-containing substituent groups. These optically active polyesters can be obtained by introducing in the nematic liquid crystalline polyesters so far explained such optically active groups as shown below using diols, dicarboxylic acids and hydroxycarboxylic acids (the * mark in the following formulae represents an optically active carbon):

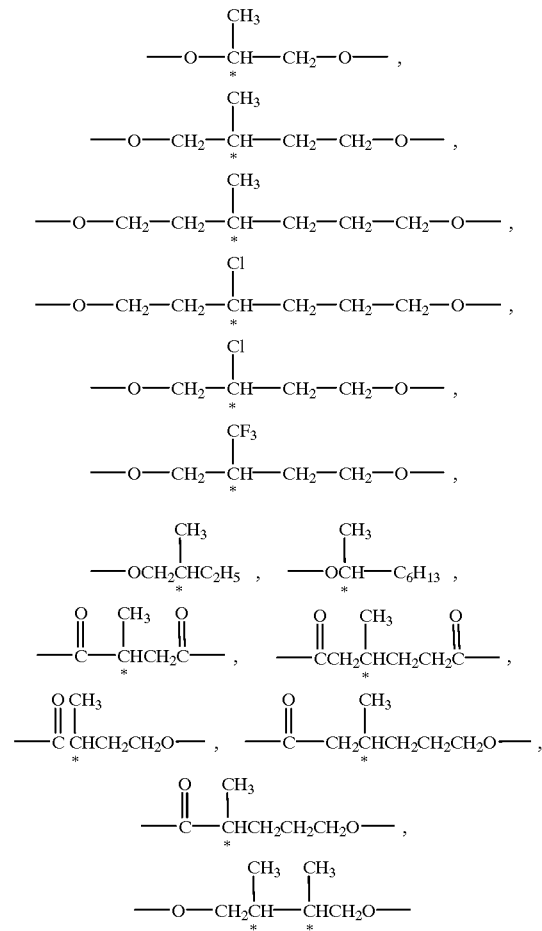

The proportion of these optically active groups in the polymers is in the range of preferably 1 to 50 mole %, more preferably 2 to 40 mole %. If the proportion is less than 1 mole %, the orientation property would be deteriorated. The molecular weights of these polymers are in the range of preferably 0.05 to 3.0, more preferably 0.07 to 2.0, in terms of intrinsic viscosity as determined at 30° C. in, for example, a mixed phenol/tetrachloroethane (60/40) solvent. A smaller intrinsic viscosity than 0.05 is not desirable because the strength of the resulting cholesteric liquid crystal line polymer will be low, while if the intrinsic viscosity is larger than 3.0, there will arise problems such as the deterioration of orientation because of too high viscosity during the formation of liquid crystal. Also important are the glass transition points of these polyesters, which exert influence on the stability of orientation after the immobilization of orientation. The glass transition temperature is usually higher than 0° C., preferably higher than 20° C. If the glass transition temperature is lower than 0° C., the immobilized liquid crystal structure is likely to be changed when used at about room temperature thereby lowering the functions based on the liquid crystal structure.

These polymers can be prepared by the foregoing melt polycondensation process or acid chloride process.

The following are typical examples of the cholesteric liquid crystalline polymer and composition used as a material of the cholesteric liquid crystal layer in the present invention described above.

Cholesteric liquid crystalline polymers represented by:

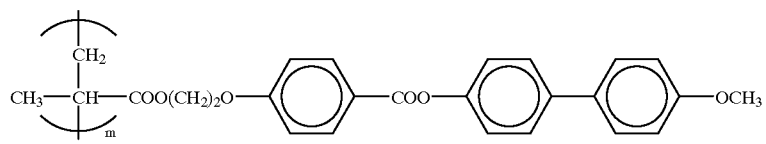
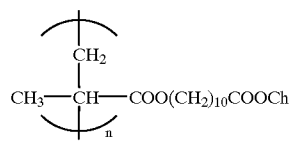

Ch: cholesteryl m/n=usually 99.9/0.1 to 70/30, preferably 99.5/0.5 to 80/20, more preferably 99/1 to 90/10

Cholesteric liquid crystalline polymers represented by:

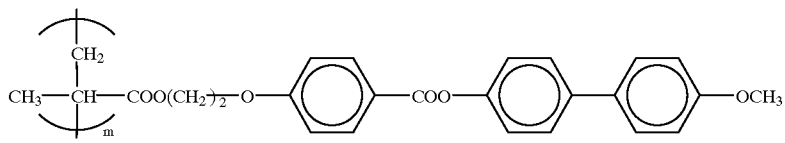

m/n=usually 99.5/0.5 to 20/80, preferably 99/1 to 30/70, more preferably 98/2 to 40/60

Cholesteric liquid crystalline polymers represented by:

m/n=usually 99.5/0.5 to 20/80, preferably 99/1 to 30/70, more preferably 98/2 to.40/60 p, q: integer of 2 to 20

Cholesteric liquid crystalline polymers represented by:

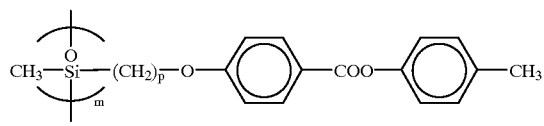

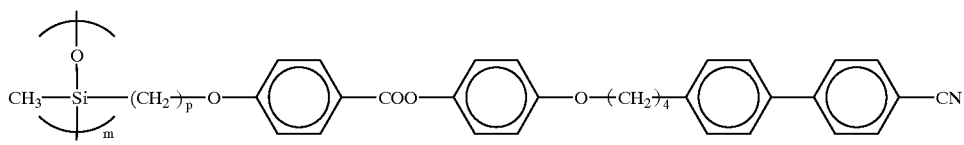

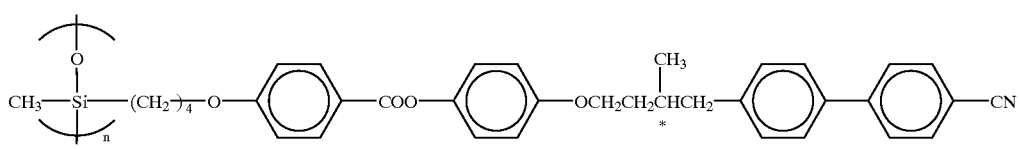

-continued

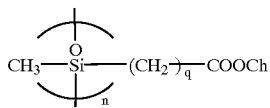

m/n=usually 99.5/0.5 to 20/80, preferably 99/1 to 30/70, more preferably 98/2 to 40/60
p, q: integer of 2 to 20

Cholesteric liquid crystalline polymers represented by:

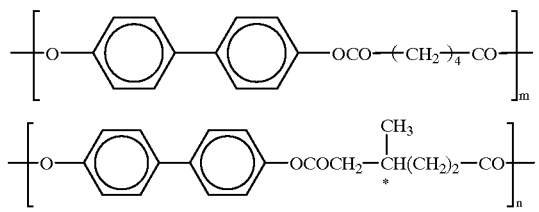

m/n=usually 99.5/0.5 to 30/70, preferably 99/1 to 40/60

Cholesteric liquid crystalline polymers represented by:

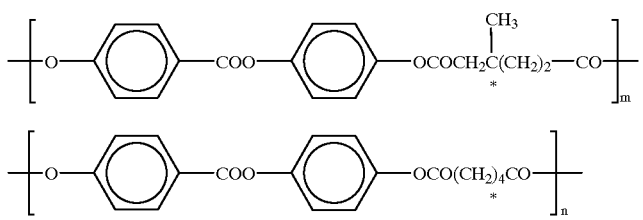

m/n=1/99 to 70/30, preferably 2/98 to 60/40

Cholesteric liquid crystalline polymers represented by:

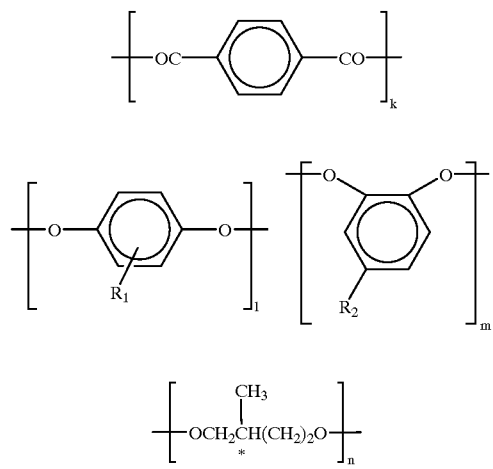

k=l+m+n
k/n=99/1 to 60/40, preferably 98/2 to 70/30
l/m=5/95 to 95/5
$R_1$, $R_2$=$C_1$ or $C_{1-6}$ linear or branched alkyl Cholesteric liquid crystalline polymers represented by:

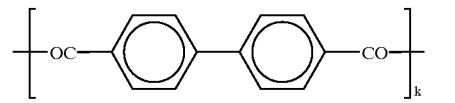

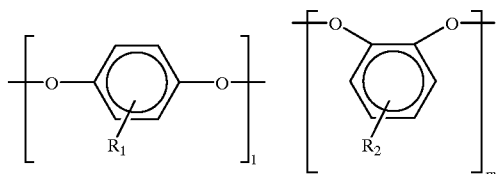

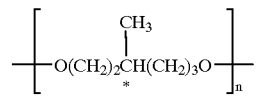

k=l+m+n
k/n=98.5/1.5 to 60/40, preferably 97/3 to 70/30
l/m=5/95 to 95/5
$R_1$, $R_2$=$C_1$ or $C_{1-6}$ linear or branched alkyl Cholesteric liquid crystalline polymers represented by:

(A)

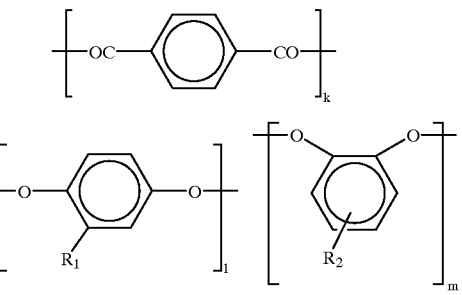

(B)

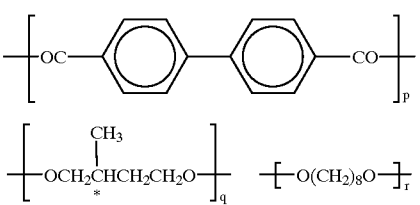

(A)/(B)=usually 99/1 to 30/70 (weight ratio), preferably 98/2 to 40/60, more preferably 95/5 to 50/50
k=l+m
l/m=85/15 to 15/85
p=q+r r/q=0/100 to 80/20, $R_1$, $R_2$=$C_1$ or $C_{1-6}$ linear or branched alkyl Cholesteric liquid crystalline polymers represented by:

(A)

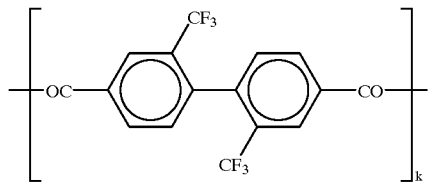

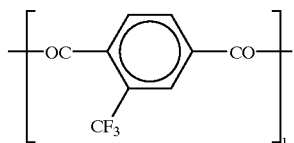

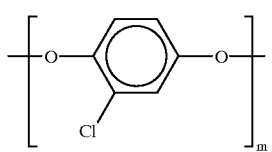

(B) cholesteryl benzoate (A)/(B)=usually 99/1 to 40/60 (weight ratio), preferably 98/2 to 50/50, more preferably 95/5 to 55/45 m=k+l k/l=80/20 to 20/80

Cholesteric liquid crystalline polymers represented by:

(A)

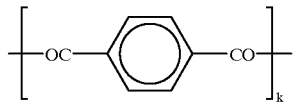

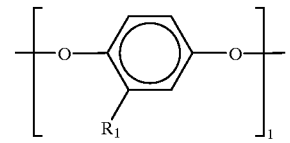

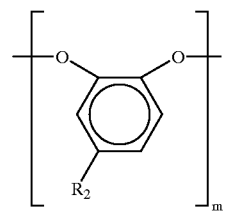

(B)

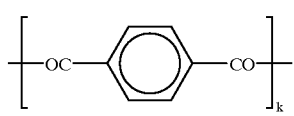

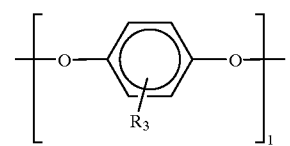

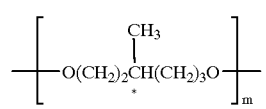

(A)/(B)=usually 99/1 to 30/70 (weight ratio), preferably 98/2 to 40/60, more preferably 95/5 to 80/20 k=l+m l/m =15/85 to 85/15 p=q+r p/r=20/80 to 80/20, $R_1$, $R_2$, $R_3$=H, Cl or $C_{1-6}$ linear or branched alkyl (A)

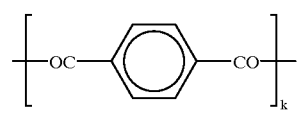

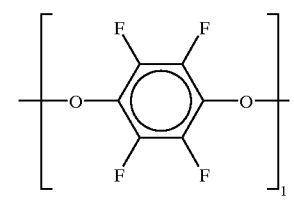

(B)

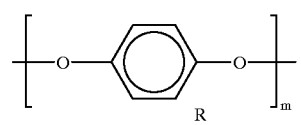

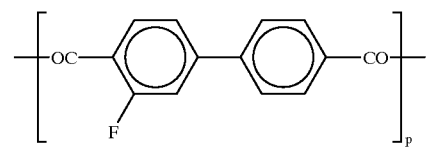

(A)/(B)=usually 98/2 to 50/50, preferably 95/5 to 60/40 k=l+m l/m=70/30 to 30/70 p=q+r r/q=0/100 to 90/10, preferably 10/90 to 80/20

R is $C_{3-6}$ linear or branched alkyl

Cholesteric liquid crystalline polymer mixtures of the polymer represented by the following and cholesteric liquid crystalline polymer mixtures represented by:

(A)

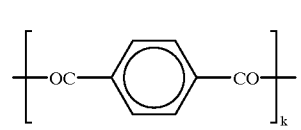

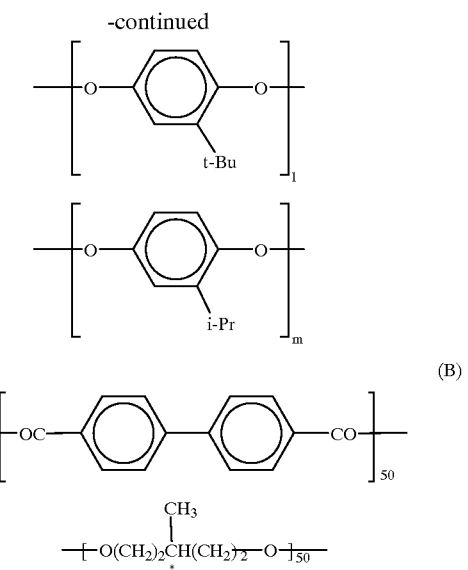

(A)/(B)=98/2 to 40/60 (weight ratio), preferably 96/4 to 50/50, more preferably 90/10 to 55/45 k+l+m l/m=85/15 to 25/75

Cholesteric liquid crystalline polymer mixtures represented by: an optically active compound:

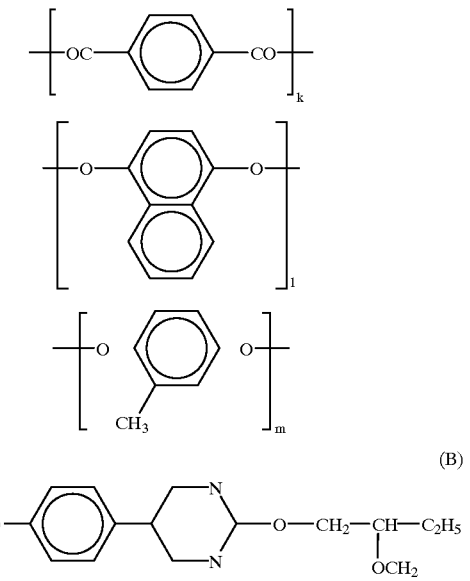

(A)/(B)=usually 98/2 to 40/40 (weight ratio), preferably 95/5 to 70/30 k=l+m l/m=85/15 to 30/70

The mark * represents an optically active carbon.

A molecular weight of such polymers is preferably in the range of 0.05–3.0, more preferably 0.07–2.0, in terms of a logarithmic viscosity number measured at 30° C. in various solvents such as tetrahydrofuran, acetone, cyclohexane, a mixed solvent of phenol/tetrachloroethane (60/40) and the like. Where a logarithmic viscosity number is less than 0.05, a strength of the resulting cholesteric liquid crystalline polymer is undesirably weakened. Where it is more than 3.0, there is posed the problem which a viscosity in forming a liquid crystal becomes so high as to cause a decrease in orientation or an extended time required for orientation.

The cholesteric liquid crystalline polymer as explained above is usually formed on an orientation film formed on a light transmitting substrate.

As the transmitting substrates which may be used herein, there may be illustrated, for example, plastic film sheets or stretched film sheets made from a polyimide, a polyamide-imide, a polyamide, a polyether-imide, a polyether-ether-ketone, a polyether-ketonoe, a polyketone-sulfide, a polyether-sulfone, a polysulfone, a polyphenylene sulfide, a polyphenylene oxide, polyethylene terephthalate, polyethylene naphthalate, a polyacetal, a polycarbonate, a polyacrylate, an acrylic resin, a polyvinyl alcohol, a polypropylene, cellulosic plastics, an epoxy resin, a phenol resin and the like, metallic substrates having slit-like channels on the surface thereof and made from aluminum, iron, copper and the like, glass substrates having slit-like etchings on the surface thereof and made from a blue flat glass, a white flat glass, quartz glass, alkali glass, borosilicate glass, flint glass and the like.

In this invention, there may be also employed various substrates as mentioned above which are subjected to surface treatment such as hydrophilic treatment or hydrophobic treatment, a rubbed plastic film substrates wherein the above plastic film sheets are subjected to rubbing treatment or plastic films which rubbing treatment is subjected to, for example, various substrates as mentioned above having, for example, rubbed polyimide films, rubbed polyimide films and the like, or various substrates as mentioned above having a bias deposited film of silicon oxide and others.

More specifically, there may be mentioned a substrate having a rubbed polyimide film, a rubbed polyimide substrate, a rubbed polyether-ether-ketone substrate, a rubbed polyether-ketone substrate, a rubbed polyether sulfone substrate, a rubbed polyphenylene sulfide substrate, a rubbed polyethylene terephthalate substrate, a rubbed polyethylene naphthalene substrate, a rubbed polyacrylate substrate, a rubbed cellulosic plastic substrate and the like.

A cholesteric liquid crystal film which may be preferred as the present cholesteric liquid crystal layer may be prepared by coating a cholesteric liquid crystalline polymer or a cholesteric liquid crystalline polymer composition having a suitable length of pitch over an oriented film formed on the light-transmitting substrate to form a coated film over the oriented film. Where there is used a cholesteric liquid crystalline polymer composition composed of a nematic liquid crystal layer and an optically active compound, in the case of admixing solutions as an example, a solution with a predetermined concentration is prepared by dissolving both components in a solvent at a predetermined ratio. Where there is used a cholesteric liquid crystalline polymer exhibiting a cholesteric orientation in itself instead of the said composition, a solution is prepared by dissolving it alone in a predetermined solvent at a predetermined concentration.

The solvent to be used in this case may be varied depending upon the type of the polymer and there may be usually any of the following solvents:

Aromatic hydrocarbons such as benzene, toluene, xylene, tetralin, methylnaphthalene and the like;

alicyclic hydrocarbons such as hexane, cyclohexane, heptane, octane, nonane, decalin and the like;

ketones such as acetone, methyl ethyl ketone, cyclohexanone and the like;

ethers such as tetrahydrofuran, dioxane, ethylene glycol dimethyl ether, ethylene glycol diethyl ether, diethylene glycol dimethyl ether, diethylene glycol diethyl ether and the like;

halogenated hydrocarbons such as methylene chloride, chloroform, dichloroethane, tetrachloroethane, carbon tetrachloride, trichloroethylene, tetrachloroethylene, orthodichlorobenzene and the like;

amides such as dimethylformamide, dimethylacetamide, N-methylpyrrolidone and the like;

alcohols such as methanol, ethanol, propanol, butanol, pentanol, hexanol, ethylene glycol, propylene glycol, methoxyethanol, ethoxyethanol, propoxyethanol, butoxyethanol, diethylene glycol, dipropylene glycol, diethylene glycol monomethyl ether, diethylene glycol monoethyl ether and the like;

phenols such as phenol, parachlorophenol, cresol and the like;

carboxylic acid esters or lactones such as ethyl acetate, propyl acetate, butyl acetate, ethylene glycol diacetate, γ-butyrolactone and the like;

carbonic acid esters such as ethylene carbonte, propylene carbonate, dimethyl carbonate, diethyl carbonate and the like;

sulfones such as dimethyl sulfoxide, sulfolane and the like;

nitriles such as acetonitrile, benzonitrile and the like;

water; and a mixture thereof.

A concentration of the solution may be greatly varied depending upon a polymer viscosity and the range of 5–50% may be usually used with the range of 10–35% being preferable. The solution thus prepared is then coated over an oriented light transmitting glass plate, plastic film or plastic sheet. An orientation method is not particularly critical and may be any of those methods wherein liquid crystal molecules are aligned parallel to the interface, for example, a method wherein a polyimide is coated over the substrate and a polyimide rubbed glass or film may be preferably used. For coating, there may be employed, for example, a spin coating method, a roll coating method, a printing method, a curtain coating method (a die coating method), a dipping/pulling up method and the like. After coating, the solvent is removed by air-drying at room temperature, by drying on a hot plate in a drying oven, by blowing hot-air and others, and a thermal treatment is applied at a predetermined temperature for a predetermined period of time to complete a monodomain cholesteric orientation. In order to assist the orientation based on an interfacial effect, the lower the polymer viscosity is, the better, and then the higher the temperature is, the more preferably, provided that a too higher temperature is not preferable because of an increased cost and deterioration of the working efficiency. Further, an isotropic phase may be present at a higher temperature region than the liquid crystal phase depending upon the type of the polymer used so that orientation will not be attained even by thermal treatment at that temperature region.

However, pitch of the cholesteric liquid crystal layer eventually prepared may exhibit some dependency on the thermal treatment temperature in compliance with the polymer used, so that there may be a need to pay a more attention to the thermal treatment conditions to be set up for the use requiring a strict pitch length. On the other hand, there may be obtained the advantage in the preparation that those films with different pitch lengths may be prepared without any need for changing the type or composition of the polymer to be used. For controlling a pitch length by thermal treatment conditions, there may be specifically mentioned a method to simply change the temperature for thermal treatment or a method wherein the treatment is first performed at a sufficient temperature for orientation, the temperature is then lowered to an appropriate temperature below the glass transition point of the polymer to form a helical structure according to the lowered temperature and the subsequent step of cooling a temperature below the glass transition temperature is applied. Moreover, as far as the thermal treatment is carried out under the same conditions, the pitch of the cholesteric layer may be identically attained with a good reproducibility.

As explained above, it is preferable to carry out the thermal treatment at a temperature above the glass transition point and below the transition point toward isotropy according to the properties of the polymer, and generally the range of 50–300° C. is preferable with the range of 100–250° C. being particularly preferable. The time required for obtaining a sufficient orientation in a liquid crystalline state on an orientation film may differ depending upon the composition and molecular weight of the polymer used, and, though not absolutely stated, the period of 30 seconds to 100 minutes is preferable with the period of 60 seconds to 60 minutes being particularly preferable. If the said time is shorter than 30 seconds, the orientation obtained will be unsatisfactory, while, if it is longer than 100 minutes, the transparency of the resulting cholesteric liquid crystal layer may be deteriorated. By performing these treatments, there may be first obtained a uniform cholesteric orientation throughout the whole upper surface of the orientation film in a liquid crystalline state.

The oriented state thus obtained may be then fixed or immobilized without impairing the cholesteric orientation by cooling to a temperature below the glass transition point of the cholesteric liquid crystalline polymer or cholesteric liquid crystalline polymer composition. Generally, where there is used a polymer having a crystal phase at a lower temperature region than the liquid crystal phase, the orientation in a liquid crystalline state may be destroyed by cooling. According to the method of this invention, such phenomenon does not occur and a cholesteric orientation can be completely fixed by using a polymer system having a glass phase under a liquid crystal phase.

The cooling temperature to be applied is not particularly critical and immobilization can be accomplished by mere transfer from the heating atmosphere into an atmosphere held at a temperature below the glass transition point. Moreover, there may be also applied an enforced-cooling such as air-cooling or water-cooling for enhancing a production efficiency. However, the helical pitch in a cholesteric liquid crystal layer thus obtained may be somewhat varied depending upon a cooling temperature applied so that it may be desirable to set up a unified cooling condition when a cholesteric structure with identical pitch is desired with a good reproducitivity.

The thickness of the cholesteric liquid crystal layer which may be used in this invention is not particularly critical, but a certain extent of the film thickness is required in order that the cholesteric liquid crystal layer may exhibit satisfactory characteristics in external appearance and the thickness above a pitch length is usually required. If the film thickness is thinner than a pitch length, a sufficient selective reflection may not be available or a sufficient light cut-off may not be achieved. Accordingly, the film thickness of the cholesteric liquid crystal layer which may be used in this invention is desirably within the range of the selective reflection wherein a part of light with a certain specific wave length may be reflected.

Controlling of a helical pitch may be easily performed by altering a ratio of an optically active unit comprising the polymer or an optical purity of the optically active unit when a cholesteric liquid crystalline polymer is used, or by altering a mixing ratio of a nematic liquid crystalline polymer and an optically active compound providing a helical structure in a cholesteric liquid crystalline polymer composition if used. There may be also obtained a cholesteric liquid crystal layer having an intermediate pitch length by using a suitable mixing ratio of two or more of the polymers or polymer compositions, said polymers individually having the helical structures with different pitch lengths, respectively. Also controlling of a pitch length may be made to some extent by changing conditions for thermal treatment.

The cholesteric liquid crystal layer obtained according to the above steps may be used as the application form to be arranged onto a photoelectric transfer element in the form of the cholesteric liquid crystal layer alone after peeling off the said orientation substrate from the cholesteric liquid crystal layer or of the layer formed on the orientation substrate as such.

Where the cholesteric liquid crystal layer is used alone, there may be illustratively mentioned a method wherein the orientation substrate is mechanically peeled off at the interface with the said liquid crystal layer by means of a roll and the like, a method wherein the substrate is dipped into a poor solvent for all structural materials and then peeled off mechanically, a method wherein the substrate is peeled off by exposing to ultrasonic irradiation in a poor solvent, a method wherein the substrate is peeled off by giving a temperature change utilizing a difference in coefficients of thermal expansion between the orientation substrate and the said cholesteric liquid crystal layer, a method wherein the orientation substrate itself or the oriented film on the orientation substrate is dissolved off, and the like. Peelability may be varied depending upon adhesion property between the cholesteric liquid crystalline polymer or cholesteric liquid crystalline polymer composition and the orientation substrate as used so that the most appropriate method to the system should be adopted.

Where the cholesteric liquid crystal layer formed on the orientation substrate is used, the layer as such may be arranged into the intended photoelectric transfer element if the orientation substrate is transparent and optically isotropic or the orientation substrate is an essential member for the photoelectric transfer element.

Also, the cholesteric liquid crystal layer may be peeled off from the orientation substrate thereon and then used by transferring it to another substrate which is suitable for a photoelectric transfer element. For example, where the orientation substrate to be used is necessary for obtaining a cholesteric orientation, but may adversely affect a photoelectric transfer element, the substrate may be used after removing from the oriented and immobilized cholesteric liquid crystal layer. Specifically stated, there may be adopted the following method:

The substrate which is suitable for the photoelectric transfer element to be fabricated into the desired photoelectric transfer device (hereinafter referred to as a second substrate) and the cholesteric liquid crystal layer on the orientation substrate are stuck together using an adhesive or a pressure-sensitive adhesive. Thereafter, the cholesteric liquid crystal layer may be peeled off at the interface between the layer and the orientation substrate and transferred to the second substrate which is suitable for the photoelectric transfer element to prepare a photoelectric transfer element.

As the second substrate which may be used for transfer, there may be employed without a particular limitation any substrate having an appropriate planar structure and a glass and a transparent plastic film having an optical isotropy are preferable. As examples of such plastic film, there may be mentioned films of polymethacrylates, polystyrenes, polycarbonates, polyether sulfones, polyphenylene sulfides, polyarylates, amorphous polyolefins, triacetyl cellulose and epoxy resins. Particularly, films of polymethyl methacrylates, polycarbonates, polyarylates, triacetyl cellulose, polyether sulfones and the like may be preferably used. Also, the polymer films as such may be used if they are an essential member for a photoelectric transfer device even though they are optically anisotropic. As examples of such polymer film, there may be mentioned films of ethylene-vinyl acetate copolymers and others which may be used in modulating a photoelectric transfer element.

As another example of the second substrate which may be used, there may be mentioned the ultraviolet cut-off layer itself as explained below.

The adhesive or pressure-sensitive adhesive for sticking the second substrate to be used for transfer and the cholesteric liquid crystal layer is not particularly critical only if it is of an optical grade. For example, there may be used an acrylic or epoxy adhesive or pressure-sensitive adhesive, or the one using ethylene-vinyl acetate copolymer or rubber.

The step for transferring the cholesteric liquid crystal layer to the second substrate suitable for a photoelectric transfer element may be performed by peeling off the orientation substrate at the interface between it and the said layer after adhering the second substrate. As examples of the peeling methods, there may be mentioned as explained above a mechanical peeling method using a roll and the like, a method of dipping in a poor solvent for all structural materials and subsequent mechanical peeling, a method of peeling by ultrasonic irradiation in a poor solvent, a method of peeling wherein a temperature change is created by utilizing the difference in thermal expansion coefficients between the orientation substrate and the said cholesteric liquid crystal layer, and a method wherein the orientation substrate itself or the oriented film on the orientation substrate is dissolved off. The peelability differs depending upon the adhesion between the liquid crystalline polymer or liquid crystalline polymer composition used and the orientation substrate used so that there should be adopted the most suitable method for the system used.

As the usage form of the cholesteric liquid crystal layer, there may be used the cholesteric liquid crystal layer which is cutting-processed according to the size thereof for each module or each photoelectric transfer element. Thus, when the cholesteric liquid crystal layer is cutting-processed according to the size of module, there may be obtained a photoelectric transfer device having a uniform, colorful external appearance unique to the cholesteric liquid crystal layer used.

When the cholesteric liquid crystal layer is cutting-processed according to each photoelectric transfer element and the module is formed with the said photoelectric transfer element aligned with the cholesteric liquid crystal layer, there may be obtained a photoelectric transfer device having color changes in separate parts. Moreover, the cholesteric liquid crystal polymer film is once produced and then made into a powdered form, which is made into a sheet-like form with a suitable binder to prepare the cholesteric liquid crystal layer and the said liquid crystal layer may be used in the aforementioned form.

As the cholesteric liquid crystal layer which may be used in this invention, there may be also mentioned a film-like product which is formed by dispersing microcapsules of a low molecular cholesteric liquid crystal in a suitable binder, in addition to the cholesteric liquid crystal film using as a starting material the aforementioned cholesteric liquid crystalline polymer or cholesteric liquid crystalline polymer composition. The film-like product thus obtained may be also used as a photoelectric transfer element in the same usage form as described in the aforementioned cholesteric liquid crystalline polymer film.

Moreover, the cholesteric liquid crystal layer may be further provided, if necessary, with a protective layer such as a transparent plastic film and the like for protecting the surface of the liquid crystal layer.

The ultraviolet cut-off layer is meant to indicate a film composed of an ultraviolet absorbing compound or an ultraviolet reflecting compound. As examples of the ultraviolet absorbing compounds, there may be used, for example, inorganic oxide ultraviolet absorbers such as titanium oxide, zinc oxide, cerium oxide and the like or organic ultrabiolet absorbers such as benzophenone, cyanoacrylate or benzotriazole compounds and the like. The absorber may be used in the form of a film wherein it is formed alone on a supporting substrate, a film wherein it is dispersed in a suitable binder on a supporting substrate, a film wherein it is chemically bound with a suitable binder on a supporting substrate or a product wherein it is dispersed or chemically bound in a supporting substrate. For the above supporting substrate, there may be used light-transmitting plastic sheets such as sheets of polyethylene terephthalates, polyethylene naphthalates, triacetyl cellulose, polyvinyl fluorides, TEDLAR® and the like, glass plates of blue flat glass, white flat glass, silica glass and the like, various pressure-sensitive adhesives, various adhesives, or transparent resin sheets used for forming the module of a photoelectric transfer element of ethylene vinyl acetate and the like.

The ultraviolet screening performance of the ultraviolet cut-off layer is not particularly critical provided that the layer will not adversely affect the object of this invention and usually the wave length for 99% cut-off is preferably in the range of 350 nm–410 nm. And, the thickness of the cut-off layer is not particularly critical and may be optionally selected for providing the desired ultraviolet cut-off performance.

The ultraviolet cut-off layer may be further provided, if necessary, with a protective layer or a hard coating layer.

It is not particularly critical how to combine the photoelectric transfer element, the cholesteric liquid crystal layer and the ultraviolet cut-off layer as depicted above, but it should be required to adopt such combination and fabrication process that all of the photoelectric transfer element, the cholesteric liquid crystal layer and the ultraviolet screening layer will not be destroyed or decomposed in fabricating a photoelectric liquid crystal device. Moreover, it should be essential in all combinations that the cholesteric liquid crystal layer be provided on the side for incidence of light in the photoelectric transfer element and the ultraviolet cut-off layer be provided further on the side for incidence of light.

These photoelectric transfer element, cholesteric liquid crystal layer and ultraviolet cut-off layer as such may be laminated or laminated via a filler such as ethylene-vinyl acetate copolymer and the like. In laminating, there may be alsoemployed acrylic or epoxy pressure-sensitive adhesives or adhesives or the one using ethylene-vinyl acetate copolymer or rubber.

The other side of the photoelectric transfer element may be protected via a filler with a backing cover of, for example, polyvinyl fluorides, TEDLAR®, corrosion-resistant aluminum plates, glass-epoxy plates and the like.

The photoelectric transfer device of this invention may be also sealed on the sides thereof with butyl rubber and the like or framed with butyl rubber or aluminum frames.

The photoelectric transfer device of this invention will be more fully explained below in regard to the detailed construction of the device.

In the case where there is used a module already completed or a commercially available module, the following four sorts of constructions may be envisaged:

1. The cholesteric liquid crystal layer is formed on the light-incident side of the module and the ultraviolet screening layer is further formed thereon, 2. The cholesteric liquid crystal layer is formed on one side of light-transmitting plastic sheet or plate or a glass plate, the ultraviolet screening layer is further formed thereon and then the laminated thus obtained is stuck or laminated on the surface of a cover glass, 3. The cholesteric liquid crystal layer is formed on one side of a light-transmitting plastic sheet or plate or a glass plate, while the ultraviolet screening layer is formed on the opposite surface thereof, and the laminate thus prepared is stuck or laminated on the surface of a cover glass so as to place the side of the cholesteric liquid crystal layer inwardly, 4. The cholesteric liquid crystal layer is formed on a light-transmitting plastic sheet or plate or a glass plate, which is then stuck on the surface of a cover glass and the ultraviolet screening layer formed on a light-transmitting plastic sheet or plate or a glass plate is further stuck or laminated thereon.

In this case, the surface to be stuck or laminated may be any of the surfaces of the cholesteric liquid crystal layer, the ultraviolet screening layer and the light-transmitting plastic sheet or plate and the glass plate.

In the case where it is incorporated during the fabrication of a module, a light-transmitting plastic sheet or plate or a glass plate, on which the cholesteric liquid crystal layer or the ultraviolet screening layer is formed, may be applied as a top cover for the device.

In this connection, the following twelve sorts of constructions may be envisaged:

1. The ultraviolet screening layer is formed on the inside of a light-transmitting plastic sheet or plate or a glass plate, while the cholesteric liquid crystal layer is formed on the outside thereof.

2. The ultraviolet screening layer is formed on the outside of a light-transmitting plastic sheet or plate or a glass plate, while the cholesteric liquid crystal layer is formed on the inside thereof, and the laminate thus prepared is stuck or laminated, 3. The light-transmitting plastic sheet or plate or a glass plate, on which the ultraviolet screening layer is formed, is stuck or laminated on the outside of a light-transmitting plastic sheet or plate or a glass plate and the cholesteric liquid crystal layer is formed on the inside thereof.

4. The light-transmitting plastic sheet or plate or a glass plate, on which the ultraviolet screening layer is formed, is stuck or laminated on the outside of a light-transmitting plastic sheet or plate or a glass plate and the cholesteric liquid crystal Layer is formed on a light-transmitting plastic sheet or plate or a glass plate is stuck or laminated on the inside thereof.

5. The cholesteric liquid crystal layer is formed on the outside of a light-transmitting plastic sheet or plate or a glass plate and the ultraviolet screening layer is further formed on the said outside.

6. The cholesteric liquid crystal layer is formed on the outside of a light-transmitting plastic sheet or plate or a glass plate and the light-transmitting plastic sheet or plate or a glass plate, on which the ultraviolet screening layer is formed, is further stuck or laminated on the said outside.

7. The light-transmitting plastic sheet or plate or a glass plate, on which the cholesteric liquid crystal layer is formed, is stuck or laminated on the outside of a light-transmitting plastic sheet or plate or a glass plate and the Ultraviolet screening layer is further formed on the said outside.

8. The cholesteric liquid crystal layer, which is formed on a light-transmitting plastic sheet or plate or a glass plate, is stuck or laminated on the outside of a light-transmitting plastic sheet or plate or a glass plate and the ultraviolet screening layer, which is formed on a light-transmitting plastic sheet or plate or a glass plate, is further stuck or laminated on the said outside.

9. The light-transmitting plastic sheet or plate or a glass plate, on which the Ultraviolet screening layer is formed, is stuck or laminated on the outside of a light-transmitting plastic sheet or plate or a glass plate and the cholesteric liquid crystal layer is further formed on the said outside.

10. The light-transmitting plastic sheet or plate or a glass plate, on which the Ultraviolet screening layer is formed, is stuck or laminated on the inside of a light-transmitting plastic sheet or plate or a glass plate and the cholesteric liquid crystal layer, which is formed on a light-transmitting plastic sheet or plate or a glass plate, is further stuck or laminated on the said inside.

11. The ultraviolet screening layer is formed on the inside of a light-transmitting plastic sheet or plate or a glass plate and the cholesteric liquid crystal layer is further formed on the said inside.

12. The ultraviolet screening layer is formed on the inside of a light-transmitting plastic sheet or plate or a glass plate and the light-transmitting plastic sheet or plate or a glass plate, on which the cholesteric liquid crystal layer is formed, is further stuck or laminated on the said inside.

In this case the surface ot be stuck or laminated may be any of the surfaces of the cholesteric liquid crystal layer, the ultraviolet screening layer and the light-transmitting plastic sheet or sheet and the glass plate.

Moreover, in the case where it is incorporated during the fabrication of a module, a light-transmitting plastic sheet or sheet and the glass plate, on which the ultraviolet screening layer is formed, may be applied as a cover for the light-incident surface of the device, and 1. a light-transmitting plastic sheet or plate or a glass plate, on which the cholesteric liquid crystal layer is formed, is stuck or laminated on the photoelectric transfer device and sealed with a filler,
2. a light-transmitting plastic sheet or plate or a glass plate, on which the cholesteric liquid crystal layer is formed, is sealed via a filler between the photoelectric transfer element and a cover for the light-incident surface.

In this case, the surface to be stuck or laminated may be any of the surfaces of the cholesteric liquid crystal layer, the ultraviolet screening layer and the light-transmitting plastic sheet or sheet and the glass plate.

Furthermore, in the case where it is incorporated during the fabrication of a module, there may be adopted the products obtained by the following procedures:

1. The ultraviolet screening layer is formed on the cover glass side of a light-transmitting plastic sheet or plate or a glass plate and the cholesteric liquid crystal layer is formed on the side of the element.
2. A light-transmitting plastic sheet or plate or a glass plate, on the cover glass side of which the ultraviolet screening layer is formed and on the element side of which the cholesteric liquid layer is formed, is stuck or laminated.
3. A light-transmitting plastic sheet or plate or a glass plate, on the cover glass side of which the ultraviolet screening layer is formed, is stuck or laminated and the cholesteric liquid crystal layer is formed on the side of the element.
4. A light-transmitting plastic sheet or plate or a glass plate, on the cover glass side of which the ultraviolet screening layer is formed, is stuck or laminated and a light-transmitting plastic sheet or plate or a glass plate, on the element side of which the cholesteric liquid crystal layer is formed, is stuck or laminated.
5. The cholesteric liquid crystal layer is formed on the cover glass side of a light-transmitting plastic sheet or plate or a glass plate and the ultraviolet screening layer is further formed thereon.
6. The cholesteric liquid crystal layer is formed on the cover glass side of a light-transmitting plastic sheet or plate or a glass plate, the ultraviolet screening layer is further formed thereon and the light-transmitting plastic sheet or plate or a glass plate thus formed is stuck or laminated.
7. The cholesteric liquid crystal layer formed on a light-transmitting plastic sheet or plate or a glass plate is stuck or laminated on the cover glass side of a light-transmitting plastic sheet or plate or a glass plate and the ultraviolet screening layer is further formed thereon.
8. The cholesteric liquid crystal layer formed on a light-transmitting plastic sheet or plate or a glass plate is stuck or laminated on the cover glass side of a light-transmitting plastic sheet or plate or a glass plate and the ultraviolet screening layer formed on a light-transmitting plastic sheet or plate or a glass plate is further stuck or laminated thereon.
9. A light-transmitting plastic sheet or plate or a glass plate, on which the ultraviolet screening layer is formed, is stuck or laminated on the element side of a light-transmitting plastic sheet or plate or a glass plate and the cholesteric liquid crystal layer is further formed on the element side thereof.
10. A light-transmitting plastic sheet or plate or a glass plate, on which the ultraviolet screening layer is formed, is stuck or laminated on the element side of a light-transmitting plastic sheet or plate or a glass plate and the cholesteric liquid crystal layer formed on a light-transmitting plastic sheet or plate or a glass plate is further stuck or laminated on the element side thereof.
11. The ultraviolet screening layer is formed on the element side of a light-transmitting plastic sheet or plate or a glass plate and the cholesteric liquid crystal layer is further formed on the element side thereof.
12. The ultraviolet screening layer is formed on the element side of a light-transmitting plastic sheet or plate or a glass plate, the cholesteric liquid crystal layer is further formed on the element side thereof, the light-transmitting plastic sheet or plate or a glass plate thus prepared is stuck or laminated, the product thus prepared is stuck or laminated on the photoelectric transfer element followed by sealing with a filler.
13. It is sealed between the photoelectric transfer element and the light-incident cover via a filler.

In this case, the surface to be stuck<or laminated may be any of the surfaces of the cholesteric liquid crystal layer, the ultraviolet screening layer and the light-transmitting plastic sheet or sheet and the glass plate.

The photoelectric transfer device of this invention as explained above is characterized in that a cholesteric liquid crystal layer is provided on the light-incident side of the photoelectric transfer element and an ultraviolet cut-off layer is provided further from the light-incident side. Accordingly, the present photoelectric transfer device may reflect a part of the light with a specific wavelength by the cholesteric liquid crystal layer so that the photoelectric transfer device may be seen vividly and, simultaneously, the cholesteric liquid crystal layer may be prevented from the deterioration thereof by the ultraviolet screening layer to make the prevention of color fading and their effects will not be dissipated even over a prolonged period for use. Moreover, the present photoelectric transfer device is particularly brilliant and vivid in its external appearance and then may be preferably employed as various sheathing materials.

DESCRIPTION OF SPECIFIC EMBODIMENTS

This invention will be explained by way of the following examples, but this invention is not limited to these examples.

EXAMPLE 1

The main chain aromatic polyester polymers as defined below were oriented and immobilized onto the rubbed transparent polyethylene terephthalate sheets.

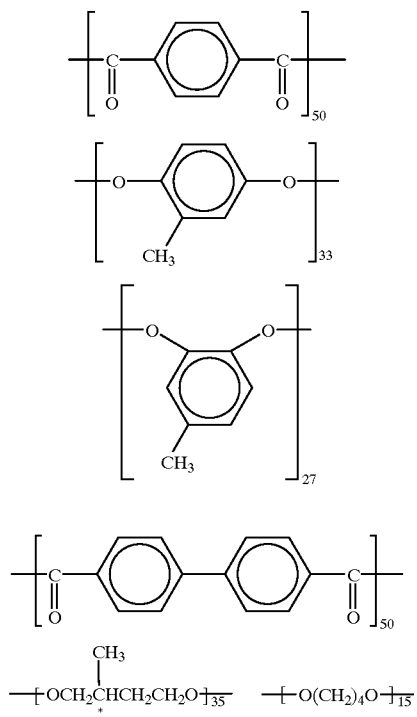

The polymer film thus oriented and immobilized was used as a cholesteric liquid crystal layer. An acrylic pressure-sensitive adhesive was coated over the said polymer film and stuck onto the cover glass surface of a commercially available solar battery module (using single crystalline silicon cells, the maximum output of 6.5 W, the short-current of 0.90 A, the release voltage of 10 V: Measurement conditions of 1 KW/m$^2$, AM 1.5 and 25° C.).

Then, a commercially available ultraviolet cut-off film (the wave length for 99% cut-off was 370 nm) was stuck thereon.

When this module was observed outdoors, yellow color was seen from the front thereof and a color change from yellow color to green color was seen as range of view was moved toward a sideways direction.

When the photoelectric transfer efficiency before the adhesion of the film was defined as 1.00, the photoelectric transfer efficiency after the adhesion of the film was 0.90.

EXAMPLE 2

An acrylic pressure-sensitive adhesive was coated over the same cholesteric liquid crystal layer as used in Example 2 and stuck onto the side of the ultraviolet cut-off layer in a white flat glass having an ultraviolet cut-off film (the wave length at 99% cut-off 400 nm).

An ethylene-vinyl acetate copolymer sheet, a single crystalline silicon cell, an ethylene-vinyl acetate copolymer sheet and the white flat glass as obtained above (placing the stuck surface inwardly) were placed onto a glass-epoxy plate and sealed under pressure to make a solar battery module.

When this module was observed outdoors, orange color was seen from the front thereof and a color change from orange color to yellowish green color was seen as range of view was moved toward a sideways direction.

When the photoelectric transfer coefficient of the module similarly made using a white flat glass not having stuck the film is defined as 1.00, the photoelectric transfer coefficient of the module having stuck the film was 0.87.

The photoelectric transfer device of this invention is characterized in that a cholesteric liquid crystal layer is provided on the light-incident side of the photoelectric transfer element and an ultraviolet cut-off layer is provided further from the light-incident side. Accordingly, the present photoelectric transfer device may reflect a part of lights with specific wavelengths by the cholesteric liquid crystal layer so that the photoelectric transfer device may be seen vividly and, simultaneously, the cholesteric liquid crystal layer may be prevented from the deterioration thereof by the ultraviolet screening layer to make the prevention of color-fading and their effects will not be dissipated even over a prolonged period of use. Moreover, the present photoelectric transfer device is particularly brilliant and vivid in its external appearance and then may be preferably employed as various sheathing materials.

We claim:

1. A photoelectric transfer device which comprises a photoelectric transfer element, a cholesteric liquid crystalline polymer film layer and an ultraviolet cut-off layer, said cholesteric liquid crystalline polymer layer being arranged between said photoelectric transfer element and said ultraviolet cut-off layer, and said ultraviolet cut-off layer being arranged at the side for the incidence of light.

2. The photoelectric transfer device as claimed in claim 1, wherein said cholesteric liquid crystalline polymer is in a liquid crystalline state, and is converted to a glass state at a temperature below the liquid crystal transition point.

3. The photoelectric transfer device as claimed in claim 1, wherein said cholesteric liquid crystalline polymer film layer is obtained by coating a solution of a cholesteric liquid crystalline polymer exhibiting a uniform, monodomain cholesteric orientation and capable of immobilizing said orientation state or a solution of a composition of a nematic liquid crystalline polymer exhibiting a uniform, monodomain nematic orientation and capable of immobilizing said orientation state and an optically active compound onto an orientation film formed on a light-transmitting substrate, drying and thermally treating the coated product thus obtained thereby forming a uniform, monodomain orientation, followed by cooling.

4. The photoelectric transfer device as claimed in claim 1, wherein the cholesteric liquid crystalline polymer has a helical structure of one or more periods toward its thickness and a pitch length of 3 μm or less.

5. The photoelectric transfer device as claimed in claim 1, wherein the cholesteric liquid crystalline polymer has a glass transition temperature higher than 30° C.

6. The photoelectric transfer device as claimed in claim 1, wherein the cholesteric liquid crystalline polymer has a glass transition temperature higher than 50° C.

7. The photoelectric transfer device as claimed in claim 1, wherein the cholesteric liquid crystalline polymer is selected from the group consisting of polyesters, polyamides, polycarbonates, polyesterimides, polyacrylates, polymethacrylates, polymalonates and polysiloxanes.

8. The photoelectric transfer device as claimed in claim 1, wherein the cholesteric liquid crystalline polymer is a liquid crystalline polyester containing an ortho-substituted aromatic unit as a constituent unit.

9. The photoelectric transfer device as claimed in claim 1, wherein the cholesteric liquid crystalline polymer is a liquid crystalline polyester having an aromatic unit having a bulky substituent group, fluorine or a fluorine-containing substituent group as a constituent group.

10. The photoelectric transfer device as claimed in claim 1, wherein the ultraviolet cut-off layer has a wave length for 99% cut-off in the range of 350 nm to 410 nm.

* * * * *